United States Patent
Stefanik et al.

(10) Patent No.: US 6,601,641 B1
(45) Date of Patent: Aug. 5, 2003

(54) OIL COOLED MULTISTAGE DEPRESSED COLLECTOR HIGH POWER AMPLIFIER

(75) Inventors: Fred M. Stefanik, Feeding Hills, MA (US); Alvin B. See, Westfield, MA (US)

(73) Assignee: Thomcast Communications, Inc., Southwick, MA (US)

( * ) Notice: Subject to any disclaimer, the term of this patent is extended or adjusted under 35 U.S.C. 154(b) by 0 days.

(21) Appl. No.: 09/542,053

(22) Filed: Mar. 31, 2000

(51) Int. Cl.$^7$ .............................. F28F 7/00; F28D 15/00
(52) U.S. Cl. ................. 165/80.4; 165/104.33; 165/104.28
(58) Field of Search .......................... 165/80.4, 104.28, 165/104.31, 104.33, 104.14; 361/699; 174/15.3; 257/714

(56) References Cited

U.S. PATENT DOCUMENTS

| | | | | |
|---|---|---|---|---|
| 2,342,412 A | * | 2/1944 | Little et al. ................... 313/12 |
| 3,306,350 A | * | 2/1967 | Beurtheret ............. 165/104.27 |
| 3,317,780 A | * | 5/1967 | Ayers ......................... 315/3.5 |
| 3,344,306 A | * | 9/1967 | Levin ........................ 315/5.39 |
| 3,780,336 A | * | 12/1973 | Giebeler ..................... 315/5.38 |
| 3,876,901 A | * | 4/1975 | James ........................ 315/3.5 |
| 4,072,188 A | * | 2/1978 | Wilson et al. ............. 165/80.4 |
| 4,096,409 A | * | 6/1978 | Hechtel ..................... 315/5.38 |
| 4,233,645 A | * | 11/1980 | Balderes et al. ............ 361/698 |
| 4,684,844 A | * | 8/1987 | Iversen ........................ 313/30 |
| 4,689,803 A | | 8/1987 | Johannessen et al. |
| 4,730,665 A | * | 3/1988 | Cutchaw ................... 165/80.4 |
| 5,010,304 A | | 4/1991 | Mueller et al. |
| 5,052,472 A | * | 10/1991 | Takahashi et al. .......... 165/80.4 |
| 5,137,079 A | * | 8/1992 | Anderson ................... 165/297 |
| 5,189,434 A | | 2/1993 | Bell |
| 5,285,347 A | * | 2/1994 | Fox et al. .................. 165/80.4 |
| 5,309,319 A | * | 5/1994 | Messina ..................... 361/699 |
| 5,440,202 A | | 8/1995 | Mathews et al. |
| 5,493,178 A | * | 2/1996 | Byram et al. .............. 315/5.38 |
| 5,522,452 A | * | 6/1996 | Mizuno et al. ............. 165/80.4 |
| 5,535,818 A | * | 7/1996 | Fujisaki et al. ......... 165/104.33 |
| 5,655,373 A | | 8/1997 | Yamashita et al. |
| 5,675,473 A | * | 10/1997 | McDunn et al. ............. 361/699 |
| 5,857,768 A | * | 1/1999 | Ziegler et al. ............... 362/294 |
| 6,000,458 A | * | 12/1999 | Wantanabe ................. 165/11.1 |
| 6,060,966 A | * | 5/2000 | Tennant et al. ............. 165/80.4 |
| 6,148,634 A | * | 11/2000 | Sherwood ..................... 62/434 |
| 6,429,589 B2 | | 8/2002 | Schult |

\* cited by examiner

*Primary Examiner*—Henry Bennett
*Assistant Examiner*—Tho V Duong
(74) *Attorney, Agent, or Firm*—Rothwell, Figg, Ernst & Manbeck

(57) ABSTRACT

The present invention provides a system and corresponding method for an oil-cooled high power amplifier system, such as an inductive output tube ["IOT"]. According to one preferred embodiment, the system has an IOT, a fluid passageway in thermal contact with the IOT, an oil-based fluid within the fluid passageway such that the oil-based fluid removes thermal energy from the IOT, an oil pump connected to the fluid passageway to circulate the oil-based fluid, and an oil heat-exchanger connected to the fluid passageway for removing the thermal energy from the oil-based fluid. The IOT preferably has a multistage depressed collector, and the oil-based fluid is preferably a commercially available transformer oil. In a preferred embodiment of the present invention, the oil-heat exchanger is connected to an external heat exchanger. The external heat exchanger has a cooling fluid passageway in thermal contact with the fluid passageway. Within the cooling fluid passageway is a cooling fluid that absorbs the thermal energy from the oil-based fluid. Also connected to the cooling fluid passageway is a cooling fluid pump that circulates the cooling fluid and a cooling fluid heat exchanger that removes the thermal energy from the cooling fluid.

In another embodiment of the present invention, the oil heat exchanger has air as the cooling medium in contact with the fluid passageway. A fan may be used to enhance the air cooling effect.

19 Claims, 4 Drawing Sheets

OIL COOLED MULTISTAGE DEPRESSED COLLECTOR HIGH POWER AMPLIFIER

BACKGROUND OF THE INVENTION

1. Field of the Invention

The present invention relates generally to transmission of broadcast television signals using high power amplifiers, and more particularly to improved oil-cooling of inductive output tube amplifiers which utilize a multiple segmented, depressed collector.

2. Background and Related Art

It is generally known in the art to use linear beam devices, such as klystrons or traveling wave tube amplifiers, to generate or amplify a high frequency RF signal. Such devices generally include an electron emitting cathode and an anode that has a central aperture. The cathode and anode are spaced apart, and an application of a high voltage potential between the two elements draws electrons from the cathode surface to form a high power electron beam that passes through the anode aperture.

One class of known linear beam device, known as inductive output tubes ["IOT"], further includes a grid positioned between the cathode and anode. An application of a RF signal to the grid relative to the cathode modulates the density of the electron beam. As the modulated electron beam propagates across a gap provided downstream within the IOT, RF fields are induced into a cavity coupled to the gap. The RF fields may then be extracted from the cavity in the form of a high power, modulated RF signal. The benefits of IOTs as power amplifiers in television transmitters, especially in common amplification configurations, are well known in terms of increased efficiency and reliability.

The performance of an IOT may be further improved through the use of a multistage depressed collector ["MSDC"]. The electrons of the modulated beam have widely varying energy levels as they exit from the output cavity. By using a multiplicity of collector electrodes which are depressed to potentials below that of the device body (i.e., the potential closer to the original electron beam energy), the spent electrons of the beam can be collected at the minimum possible energy. By recovering most of the remaining kinetic energy of the spent electron beam in depressed stages, higher operating efficiency can be achieved because less of the beam energy not used by the RE conversion is lost by conversion of kinetic energy into heat. An IOT with an MSDC is described in U.S. Pat. No. 5,440,202 to H. Mathews et al. for ELECTRON BEAM DEVICE HAVING A DIRECT CURRENT FEED WITH SWITCHING STAGES THEREIN, the subject matter of which is incorporated in the entirety by reference herein.

Even in an IOT with an MSDC, much of the energy of the electron beam is converted to thermal energy, which heats the components of the IOT. More specifically, the collector is heated by the thermal energy from the electron beam. Thus, the IOT, and the collector in particular, must be capable of withstanding very high operating temperatures, so it is necessary to construct the components of IOT such as the collector from heat resilient materials. However, the localized heat accumulation in the collector may distort the electron beam and otherwise degrade the performance. Accordingly, it is desirable to cool the IOT collector to improve performance.

It is generally known to cool other types of radio-frequency ["RF"] amplifiers. For example, U.S. Pat. No. 5,010,304 by Mueller et al. for CRYOGENICALLY-COOLED RADIO-FREQUENCY POWER AMPLIFIERS provides an amplifier that positions components of the amplifier onto a heat sink having at least one surface in contact with a cryogenic fluid. In this system, thermal energy is transferred from the amplifier to the heat sink to the cryogenic fluid. Similarly, U.S. Pat. No. 5,655,373 by Ju for ANTENNA MAST-TOP MOUNTABLE THERMO-ELECTRICALLY COOLED AMPLIFIER ENCLOSURE SYSTEM discloses an RF amplifier having a fan to create an air flow to cool the elements of the amplifier and to dissipate the thermal energy away from the amplifier. It is also generally known to use oil fluid to cool and insulate components of the amplifier, as suggested by U.S. Pat. No. 5,189,434 by Bell for MULTI-MODE ANTENNA HAVING PLURAL RADIATORS COUPLED VIA HYBRID CIRCUIT MODULES and U.S. Pat. No. 4,689,803 by Johannesssen et al. for ANTENNA TUNING SYSTEM AND METHOD.

A generally known cooled-IOT system uses a flow of ambient air to dissipate the radiant thermal energy from the IOT. However, the air-cooled system has limited ability to cool the collector because of the limited heat capacity of gases. Furthermore, the air flows have varying pressure and velocity, which allow unequal cooling of IOT. The unequal cooling may lead to the formation of relatively hot spots, which may degrade the collector of the IOT. This can result in failure of the vacuum integrity of the IOT.

Alternatively, another generally known cooled-IOT system uses the circulation of a water-based fluid to remove the thermal energy from the IOT. However, water-based fluids are inherently incompatible with high-powered electrical applications, especially where there are voltages on the elements which need cooling. For example, the water-based fluid may damage the delicate electronic circuitry of the IOT. In addition, electrolysis may occur in a system containing a water-based fluid. As a result, the water-cooled systems are relatively expensive to produce because it requires use of high grade plastics and stainless-steel based pumps for proper operation of the system. Furthermore, the water-based fluid cooling systems are relatively expensive and difficult to maintain. The use of water-based fluid as a cooling media requires careful engineering to prevent the water-based fluid from damaging the electronic circuitry and to prevent electrolysis from occurring in the system. In particular, the water-based fluid must be continually purified to remove contaminants that will contribute to electrolysis that will damage the IOT. The water-cooled system also requires periodic maintenance to maintain correct operation.

Thus, it is the goal of the present invention to provide a liquid-cooled IOT system that effectively cools the IOT and is relatively inexpensive to build and easy to maintain.

SUMMARY OF THE INVENTION

Accordingly, the present invention provides a solution to the shortcomings of the prior art as discussed above.

In particular, the present invention provides a system and corresponding method for an oil-cooled IOT. In one embodiment, the system comprises an IOT, a fluid passageway in thermal contact with the IOT, an oil-based fluid within the fluid passageway such that the oil-based fluid removes thermal energy from the IOT, a fluid pump connected to the fluid passageway to circulate the oil-based fluid, and a fluid heat-exchanger connected to the fluid passageway for removing the thermal energy from the oil-based fluid. The IOT preferably has an MSDC, and the oil-based fluid is preferably commercially available transformer oil.

In a preferred embodiment of the present invention, the oil-heat exchanger is connected to an external heat exchanging system. The external heat exchanger has a cooling fluid passageway in thermal contact with the oil-fluid passageway. Within the cooling fluid passageway is a cooling fluid that absorbs the thermal energy from the oil-based fluid. Also connected to the cooling fluid passageway is a cooling fluid pump that circulates the cooling fluid and an external cooling fluid heat exchanger that removes the thermal energy from the cooling fluid. This cooling fluid can be a water-based fluid or air.

BRIEF DESCRIPTION OF THE DRAWINGS

The invention will be described in detail with reference to the following drawings in which.

DETAILED DESCRIPTION OF THE PREFERRED EMBODIMENTS

Figure 1:
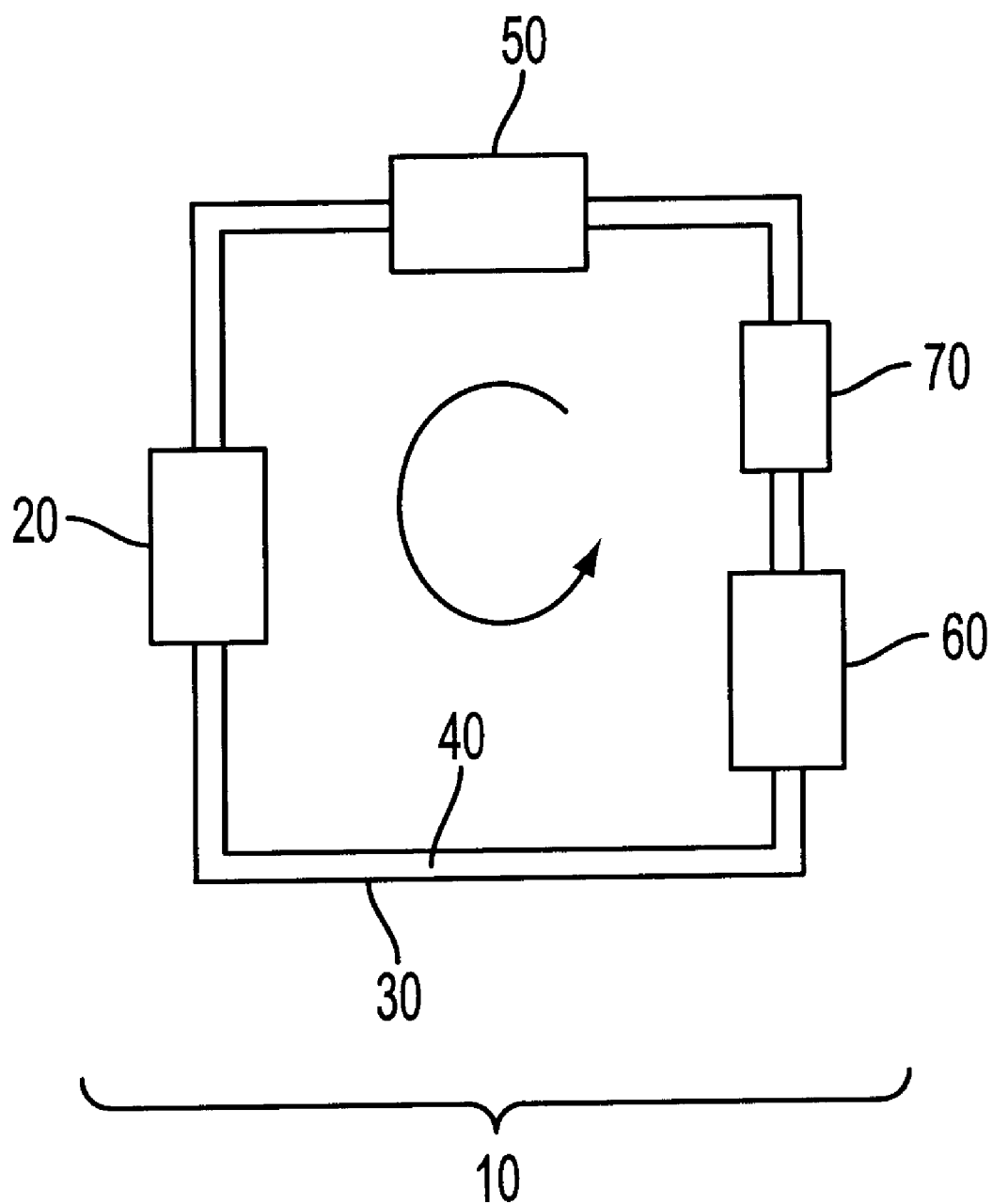
FIG. 1 is a schematic diagram of an oil-cooled IOT system in accordance with an embodiment of the present invention.

As illustrated FIG. 1, the present invention provides a cooled IOT system 10. The oil-cooled IOT system 10 comprises an IOT 20, a fluid passageway 30 containing oil-based fluid 40, an oil pump 50 for circulating the oil-based fluid 40, and an oil heat-exchanger 60 for removing thermal energy from the oil-based fluid 40. In the cooled IOT system 10, the IOT 20 and the fluid passageway 30 are in thermal contact such that thermal energy from the IOT 20 is transferred to the oil-based fluid 40. For example, the fluid passageway 30 may physically contact the IOT 20. Similarly, a heat conducting substance (not illustrated) may be interposed between the IOT 20 and the fluid passageway 30. Alternatively, the fluid passageway 30 surrounds the IOT 20 such that the oil-based fluid 40 directly contacts the IOT 20 or parts of the IOT 20. The cooled IOT system 10 could be made as part of a high powered amplifier, allowing easy installation of a transmitter containing the cooled IOT system 10. The individual components of the cooled IOT system 10 are now described in greater detail.

Figure 2:
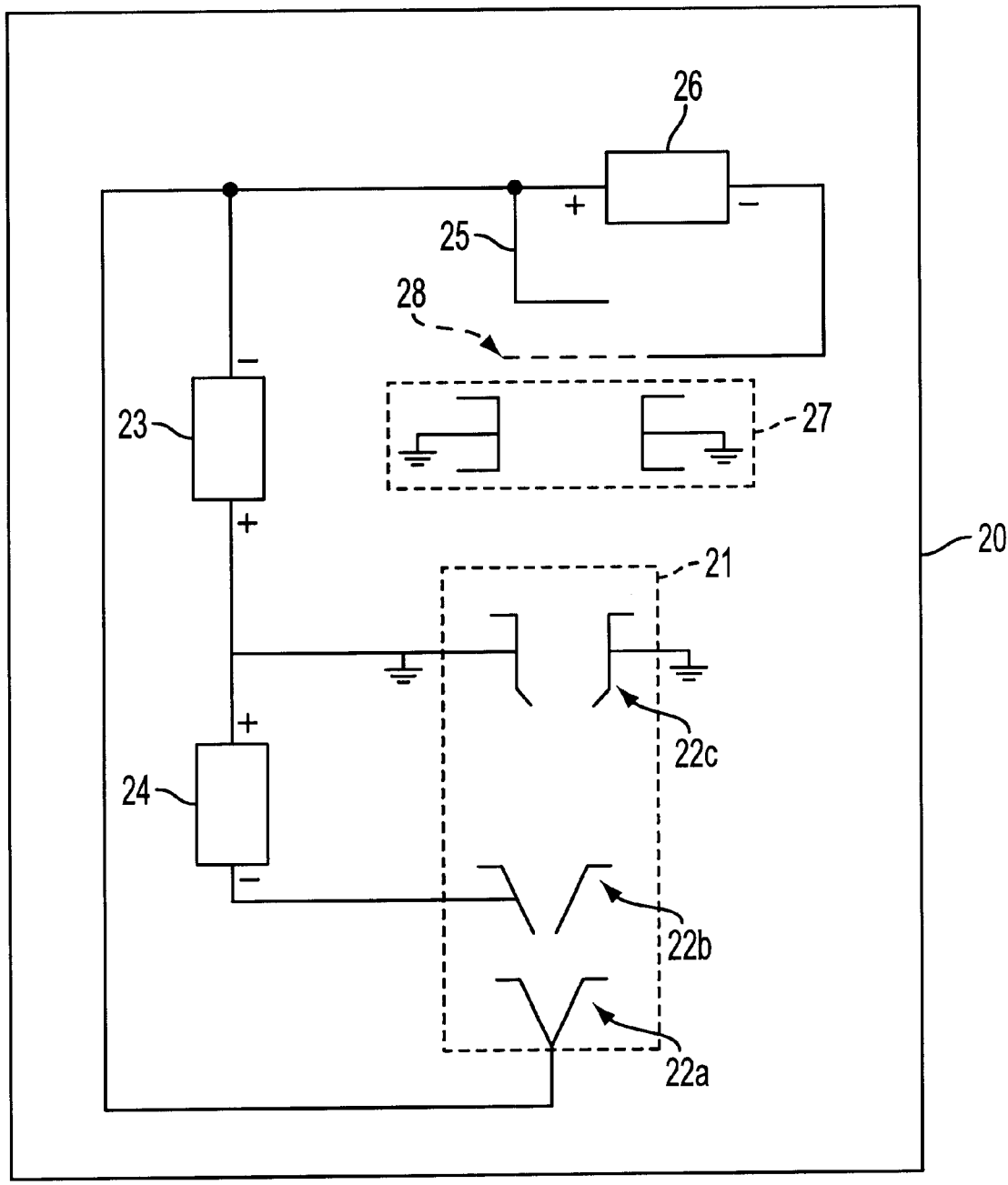
FIG. 2 is a circuit diagram of a known MSDC-IOT.

The IOT 20 is generally known in the art, as described in the above text. In particular, the IOT 20 preferably has an MSDC 21 for improved performance. FIG. 2 illustrates the IOT 20 having the MSDC 21 with first, second and third collectors, 22a–c. However, it should be appreciated that any number of collectors may be employed. In the MSDC 21, the third, second and first collectors 22c–a are respectively configured to have progressively larger potential differences away from a cathode 25. Two power sources 23 and 24 of varying levels may be used to provide the voltage bias to the collectors 22a–c. As illustrated in FIG. 2, a first power source 23 and a second power source 24 are employed. The third collector 22c is grounded, the second collector 22b is biased by the second power source 24, and the first collector 22a is biased by the first power source 23. During operation of the IOT, a third power source 26 applies a bias between the cathode 25 and a grid 28. The potential difference between cathode 25/grid 28 and anode 27 as supplied by power source 23 initiates an electron beam (not illustrated), which is modulated by grid 28. As a result, the IOT 20 may become very hot, especially in the collector segments 22a–22c.

In the present invention, the thermal energy is transferred from IOT 20 to the oil-based fluid 40. The oil-based fluid 40 must be non-conductive and must not react with the IOT 20. In a preferred embodiment, the oil-based fluid 40 is a commercially available transformer oil. For example, DIALA AX model produced by Shell Oil Company of Houston, Tex. may be used. Because oil-based fluid 40 is a good high voltage insulator that has been used for many years to reliably cool high voltage transformers without needing periodic re-purification, it is an ideal choice for this type of application.

The fluid passageway 30 contains the oil-based fluid 40. In particular, the fluid passageway 30 contains insulating tubing that connects between the collector segments 22a–22c that are at a high voltage potential. The fluid passageway 30 may be constructed from any type of material or combination of materials, such as plastics, ceramics, or metals, but is preferably heat conductive in the area of the collector segments to allow thermal energy from the collectors 22a–22c to reach the oil-based fluid 40.

The cooled IOT system also preferably includes an oil tank 70 to contain the oil-fluid 40 when it is not circulating through fluid passageway 30. The oil tank 70 is any type structure such as a well or receptacle for holding excess amounts of the oil-fluid 40. The oil tank may be constructed from virtually any type of compatible material.

The oil pump 50 connects to the fluid passageway 30 to circulate the oil-based fluid 40. The oil pump 50 may be any compatible type of fluid pump. Specifically, the oil pump 50 must be non-reactive with the oil-based fluid 40 and preferably imparts little thermal energy to the oil-based fluid 40. Such pumps are commonly available and known and thus will not be discussed further. For example, the oil pump 50 may be similar to the 5AB27535 model produced by Gould's Pump Inc. of Seneca Falls, N.Y.

The oil heat-exchanger 60 connects to the fluid passageway 30 to remove the thermal energy from the oil-based fluid 40. For example, oil heat-exchanger 60 may provide air contact with the fluid passageway 30, such that thermal energy from the oil-based fluid 40 is dissipated into the air.

Figure 3:
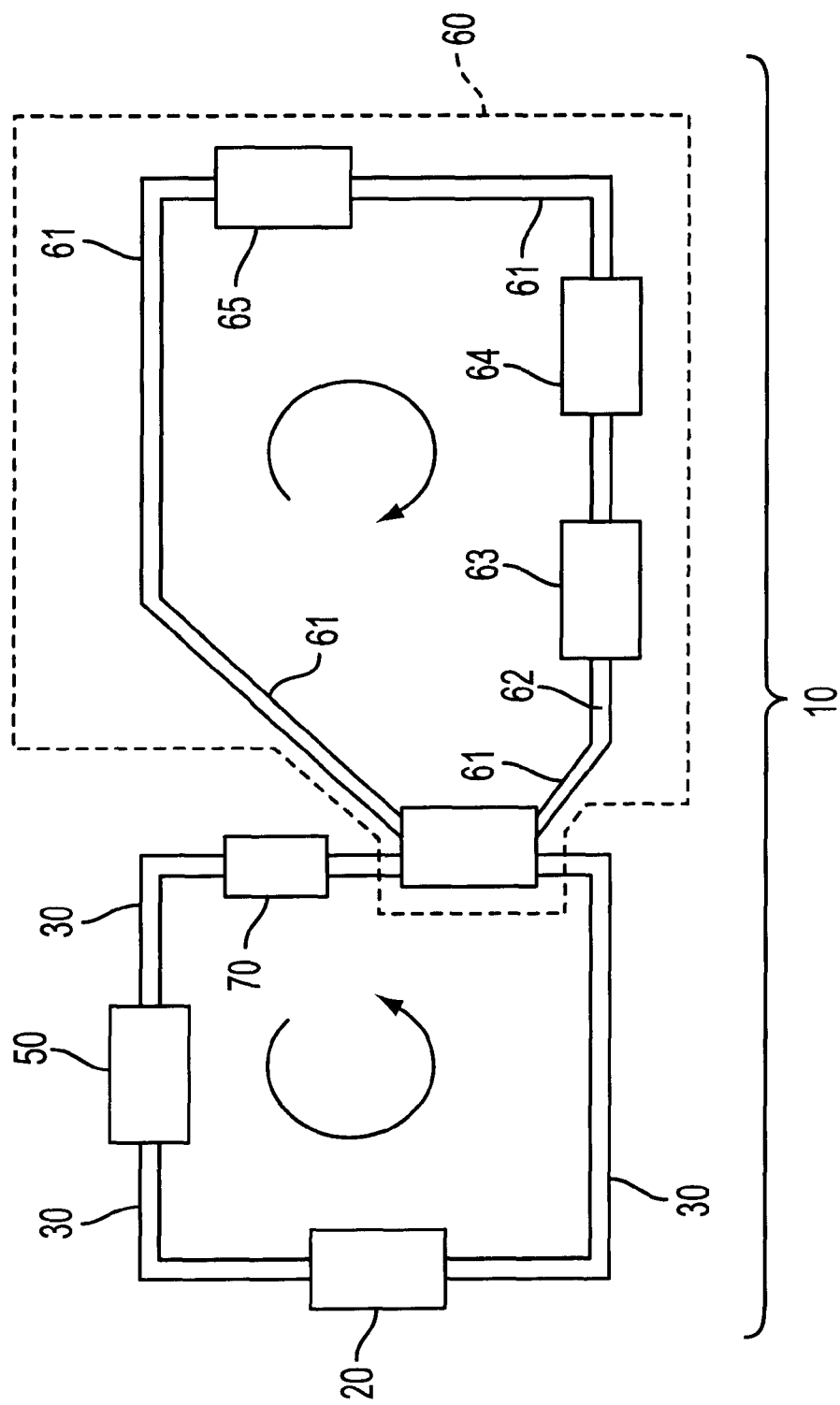
FIG. 3 is a schematic diagram of an oil-cooled MSDC-IOT system having an external heat exchanger in accordance with a preferred embodiment of the present invention.

Oil heat-exchanger 60 may be a liquid-to-liquid heat exchanger, as illustrated in FIG. 3. In this embodiment, the oil heat-exchanger 60 includes a cooling fluid passageway 61 in thermal contact with the fluid passageway 30. For example, the cooling fluid passageway 61 may physically contact the fluid passageway 30, or a heat conductive material (not illustrated) may be interposed between the cooling fluid passageway 61 and the fluid passageway 30. A cooling fluid 62 flows within the cooling fluid passageway 61, such that the cooling fluid 62 absorbs the thermal energy from the oil-based fluid 40 within the fluid passageway 30. A cooling fluid pump 63, connected to the cooling fluid passageway 61, circulates the cooling fluid 62 within the cooling fluid passageway 61. A cooling tank 64 stores any excess amounts of the cooling fluid 62, and a cooling fluid heat exchanger 65 removes thermal energy from the cooling fluid 62.

The cooling fluid 62 may be any suitable coolant. Typical coolants include water, water/glycol mixtures, or air. For example, the cooling fluid 62 may be a mixture of equal amounts of water and DowTherm® SR-1, an organic glycol produced Dow Chemical Company of Midland, Mich.

The cooling fluid passageway 61 is analogous to the fluid passageway 30, and the two elements are similarly constructed. Similarly, cooling fluid pump 63 is analogous to the oil pump 50, and cooling tank 64 is analogous to the oil tank 70.

The cooling fluid heat exchanger 65 typically provides air contact with the cooling fluid passageway 61, such that thermal energy from the cooling fluid 62 is dissipated into the air.

Figure 4:
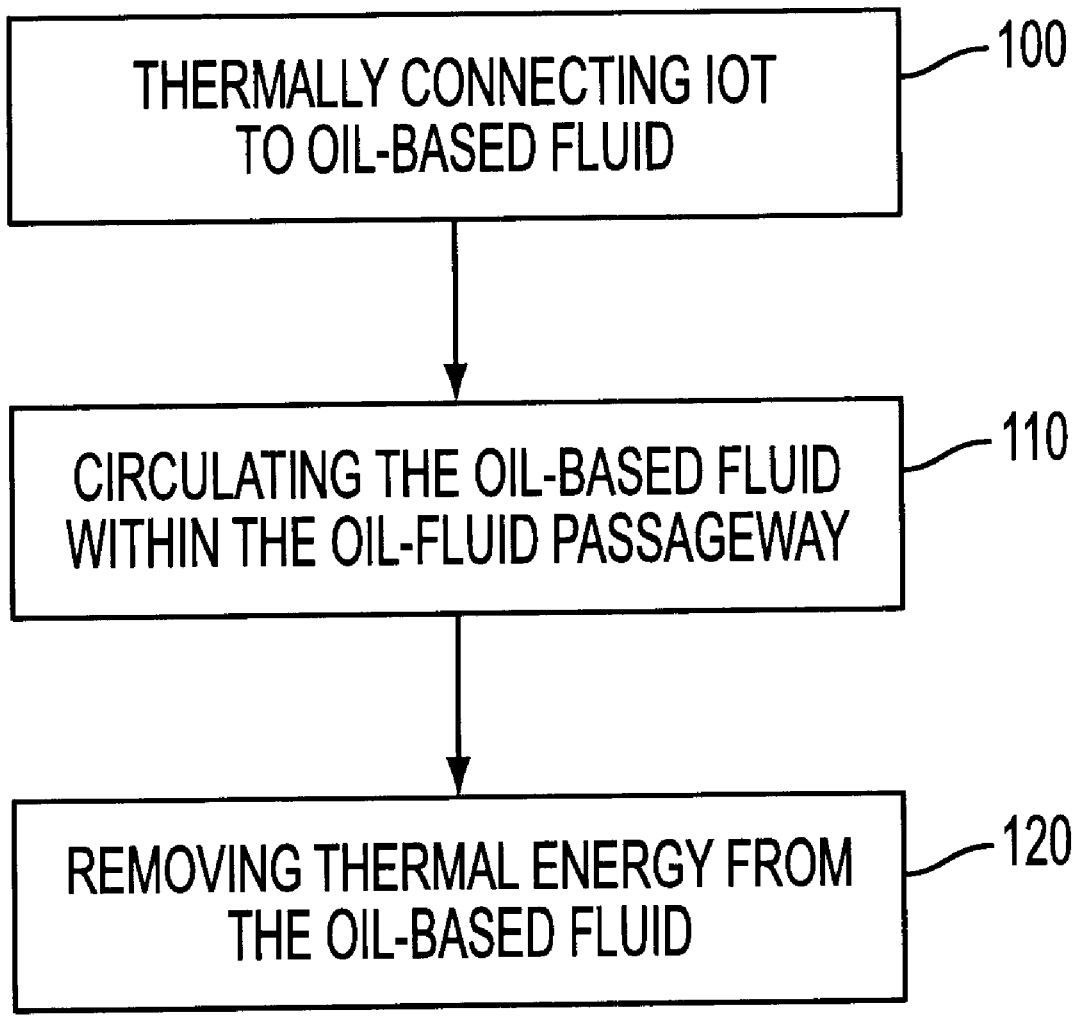
FIG. 4 is a flow chart of a method for an oil-cooled IOT in accordance with an embodiment of the present invention.

A corresponding method for using oil for cooling an IOT is illustrated in FIG. 4. In step 100, the IOT or components of the IOT are thermally connected to an oil-based fluid that removes thermal energy from the IOT. As described above, the oil-based fluid may come in physical contact with the IOT. Alternatively, the oil-based fluid is contained in a passageway in proximity of the IOT, such that thermal energy is transferred to the oil-based fluid via the passageway.

A second step 110 involves circulating the oil-based fluid. This step 110 removes the heated oil-based fluid away from the IOT. As previously described, the step 110 may be accomplished by a pump.

In a third step 120, the thermal energy removed from the oil-based fluid. As described above, cooling of the oil-based fluid may be achieved using a passageway that allows the surrounding air to remove the thermal energy from the oil-based fluid or by employing an external cooling unit, as generally known in the art.

The invention having been thus described, it will be apparent to those skilled in the art that the same may be varied in many ways without departing from the spirit and scope of the inventions. All such modifications are intended to be encompassed by the following claims. For example, while a preferred embodiment of the invention has been described wherein the amplifying device 20 is an IOT, the system could be used with many other high-power amplifier devices, such as klystrons, diacrodes, tetrodes, triodes, pentodes, or traveling wave tubes (TWTs).

What is claimed is:

1. An oil-cooled high power amplifier system comprising:
   a high power amplifying device including a multistage depressed collector (MSDC) having a plurality of collector electrodes;
   a hollow fluid passageway thermally connected to one or more collector electrodes of the MSDC of the high power amplifying device;
   an oil-based fluid contained in the fluid passageway, wherein the oil-based fluid removes thermal energy from the collector electrodes of the MSDC of the high power amplifying device;
   an oil pump connected to the fluid passageway to circulate the oil-based fluid; and
   an oil heat-exchanger connected to the fluid passageway for removing the thermal energy from the oil-based fluid, said oil heat-exchanger including
      a cooling fluid passageway in thermal contact with said hollow fluid passageway;
      a cooling fluid within said cooling fluid passageway, wherein said cooling fluid absorbs thermal energy from said oil-based fluid;
      a cooling fluid heat exchanger connected to said cooling fluid passageway for removing thermal energy from said cooling fluid;
      a cooling fluid tank functioning as a reservoir and for accommodating thermal expansion of said cooling fluid; and
      a cooling fluid pump connected to said cooling fluid passageway for circulating said cooling fluid within said cooling fluid passageway.

2. The system of claim 1 wherein the oil-based fluid is a commercially available transformer oil.

3. The system of claim 1 further comprising an oil tank connected to the fluid passageway functioning as a reservoir and for accommodating thermal expansion.

4. The system of claim 1, wherein the high power amplifying device is an inductive output tube (IOT).

5. The system of claim 1, wherein the high power amplifying device is a klystron.

6. The system of claim 1, wherein the high power amplifying device is a diacrode.

7. The system of claim 1, wherein the high power amplifying device is a tetrode.

8. The system of claim 1, wherein the high power amplifying device is a triode.

9. The system of claim 1, wherein the high power amplifying device is a pentode.

10. The system of claim 1, wherein the high power amplifying device is a traveling wave tube.

11. A method for cooling a high power amplifying device including a multistage depressed collector (MSDC) having a plurality of collector electrodes, the method comprising the steps of:
    providing a heat-exchanger including
       a cooling fluid passageway in thermal contact with an oil-based fluid passageway,
       a cooling fluid within said cooling fluid passageway, wherein said cooling fluid absorbs thermal energy from an oil-based fluid in said oil-based fluid passageway,
       a cooling fluid heat exchanger connected to said cooling fluid passageway for removing thermal energy from said cooling fluid,
       a cooling fluid tank functioning as reservoir and for accommodating thermal expansion of said cooling fluid, and
       a cooling fluid pump connected to the cooling fluid passageway to circulate the cooling fluid;
    thermally connecting one or more collector electrodes of the MSDC of the high power amplifying device to said oil-based fluid that removes thermal energy from the collector electrodes of the MSDC of the high power amplifying device;
    circulating the oil-based fluid through the oil-based fluid passageway to said heat exchanger and
    removing the thermal energy from the oil-based fluid in the heat exchanger.

12. The method of claim 11, wherein the high power amplifying device is an inductive output tube (IOT).

13. The method of claim 11, wherein the high power amplifying device is a klystron.

14. The method of claim 11, wherein the high power amplifying device is a diacrode.

15. The method of claim 11, wherein the high power amplifying device is a tetrode.

16. The method of claim 11, wherein the high power amplifying device is a triode.

17. The method of claim 11, wherein the high power amplifying device is a pentode.

18. The method of claim 11, wherein the high power amplifying device is a traveling wave tube.

19. An oil-cooled high power amplifier system comprising:

a high power amplifying device;

a hollow fluid passageway thermally connected to the high power amplifying device;

an oil-based fluid contained in the fluid passageway, wherein the oil-based fluid removes thermal energy from the high power amplifying device;

an oil pump connected to the fluid passageway to circulate the oil-based fluid; and an oil heat-exchanger connected to the fluid passageway for removing the thermal energy from the oil-based fluid, said oil heat-exchanger including
- a cooling fluid passageway in thermal contact with said hollow fluid passageway;
- a cooling fluid within said cooling fluid passageway, wherein said cooling fluid absorbs thermal energy from said oil-based fluid;
- a cooling fluid heat exchanger connected to said cooling fluid passageway for removing thermal energy from said cooling fluid;
- a cooling fluid tank functioning as a reservoir and for accommodating thermal expansion of said cooling fluid; and
- a cooling fluid pump connected to said cooling fluid passageway for circulating said cooling fluid within said cooling fluid passageway.

* * * * *